(12) United States Patent
Shamouilian et al.

(10) Patent No.: US 6,863,019 B2
(45) Date of Patent: Mar. 8, 2005

(54) SEMICONDUCTOR DEVICE FABRICATION CHAMBER CLEANING METHOD AND APPARATUS WITH RECIRCULATION OF CLEANING GAS

(75) Inventors: Shamouil Shamouilian, San Jose, CA (US); Canfeng Lai, Fremont, CA (US); Michael Santiago Cox, Davenport, CA (US); Padmanabhan Krishnaraj, San Francisco, CA (US); Tsutomu Tanaka, Santa Clara, CA (US); Sebastien Raoux, Cupertino, CA (US); Peter I. Porshnev, San Jose, CA (US); Thomas Nowak, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/159,794

(22) Filed: May 30, 2002

(65) Prior Publication Data

US 2003/0036272 A1 Feb. 20, 2003

Related U.S. Application Data

(63) Continuation-in-part of application No. 09/593,729, filed on Jun. 13, 2000, now abandoned.
(60) Provisional application No. 60/295,448, filed on Jun. 1, 2001.

(51) Int. Cl.[7] ............................. C23C 16/00; C23F 1/00; H01L 21/306
(52) U.S. Cl. .............. 118/723 R; 118/715; 156/345.29; 156/345.35; 134/1.1; 134/1.2
(58) Field of Search ..................... 118/723 R, 715; 156/345.29, 345.35; 134/1.1, 1.2

(56) References Cited

U.S. PATENT DOCUMENTS

| | | | |
|---|---|---|---|
| 3,867,216 A | * | 2/1975 | Jacob ..................... 438/725 |
| 4,336,414 A | | 6/1982 | Suzuki et al. |
| 5,028,556 A | | 7/1991 | Chang |
| 5,417,742 A | | 5/1995 | Tamhankar et al. |
| 5,688,405 A | | 11/1997 | Dickinson et al. |

(List continued on next page.)

FOREIGN PATENT DOCUMENTS

| | | |
|---|---|---|
| DE | 1 507 839 | 1/1970 |
| DE | 41 10 361 A1 | 10/1992 |

(List continued on next page.)

OTHER PUBLICATIONS

Ohiwa et al., "Greenhouse Effect and LSI Process Technology", Ultra Clean Technology, vol. 11, No. 3, 1999, pp. 169–171.

(List continued on next page.)

Primary Examiner—Parviz Hassanzadeh
Assistant Examiner—Karla Moore
(74) Attorney, Agent, or Firm—Dugan & Dugan

(57) ABSTRACT

A method of cleaning a semiconductor fabrication processing chamber involves recirculation of cleaning gas components. Consequently, input cleaning gas is utilized efficiently, and undesirable emissions are reduced. The method includes flowing a cleaning gas to an inlet of a processing chamber, and exposing surfaces of the processing chamber to the cleaning gas to clean the surfaces, thereby producing a reaction product. The method further includes removing an outlet gas including the reaction product from an outlet of the processing chamber, separating at least a portion of the reaction product from the outlet gas, and recirculating a portion of the outlet gas to the inlet of the processing chamber.

6 Claims, 9 Drawing Sheets

U.S. PATENT DOCUMENTS

| | | | |
|---|---|---|---|
| 5,693,179 A | | 12/1997 | Blackburn et al. |
| 5,708,556 A | | 1/1998 | van Os et al. |
| 5,785,741 A | * | 7/1998 | Li et al. .......................... 96/4 |
| 5,812,403 A | | 9/1998 | Fong et al. |
| 5,818,018 A | | 10/1998 | Conboy et al. |
| 5,949,076 A | * | 9/1999 | Ohtoshi et al. ......... 250/396 R |
| 5,964,949 A | | 10/1999 | Savas |
| 5,997,737 A | | 12/1999 | Sturdevant et al. |
| 6,032,484 A | * | 3/2000 | Chernyakov et al. ......... 62/624 |
| 6,045,618 A | | 4/2000 | Raoux et al. |
| 6,187,072 B1 | | 2/2001 | Cheung et al. |
| 6,193,802 B1 | | 2/2001 | Pang et al. |
| 6,194,628 B1 | | 2/2001 | Pang et al. |
| 6,206,970 B1 | | 3/2001 | Atwell |
| 6,332,925 B1 | * | 12/2001 | Noji et al. ................ 118/715 |
| 6,334,928 B1 | * | 1/2002 | Sekine et al. .......... 156/345.29 |
| 6,383,301 B1 | | 5/2002 | Bell et al. |
| 2003/0029566 A1 | * | 2/2003 | Roth ..................... 156/345.29 |

FOREIGN PATENT DOCUMENTS

| | | | | |
|---|---|---|---|---|
| EP | | 0 636 702 A2 | 2/1995 | |
| EP | | 0781599 | 7/1997 | |
| EP | | 910472 | 4/1999 | |
| EP | | 1 164 628 A2 | 12/2001 | |
| JP | | 55121886 | 9/1980 | |
| JP | | 56054201 | 5/1981 | |
| JP | | 61051928 A | 3/1986 | |
| JP | | 02251799 | 10/1990 | |
| JP | | 06281366 | 10/1994 | |
| JP | | 08269721 A | * 10/1996 | ........... C23C/16/44 |
| JP | | 09251981 | 9/1997 | |
| JP | | 10085555 A | 4/1998 | |
| JP | | 10260296 | 9/1998 | |
| JP | | 11005013 | 1/1999 | |
| RO | | 101721 | 11/1991 | |

OTHER PUBLICATIONS

Ohiwa et al., "A New Gas Circulation RIE," IEEE, 1999, pp. 259–262.

Ohiwa et al., "A New Gas Circulation RIE," IEEE Transactions on Semiconductor Manufacturing, vol. 13, No. 3, Aug. 2000, pp. 310–314.

U.S. patent application Publication No.: US 2002/0034880 A1, Pub. Date: Mar. 21, 2002.

U.S. patent application Publication No.: US 2001/0051232 A1, Pub. Date: Dec. 13, 2001.

* cited by examiner

SEMICONDUCTOR DEVICE FABRICATION CHAMBER CLEANING METHOD AND APPARATUS WITH RECIRCULATION OF CLEANING GAS

This application is a continuation-in-part of U.S. patent application Ser. No. 09/593,729, filed Jun. 13, 2001, now abandoned, titled "Methods and Apparatus for Increasing the Utilization Efficiency of Gases During Semiconductor Processing", and claims priority from U.S. Provisional Patent Application Ser. No. 60/295,448, filed Jun. 1, 2001 and titled "Semiconductor Device Fabrication Chamber Cleaning Method and Apparatus with Recirculation of Cleaning Gas". Both of these patent applications are hereby incorporated by reference herein in their entirety.

FIELD OF THE INVENTION

The present invention relates generally to semiconductor device processing, and is more specifically concerned with methods and apparatus for cleaning processing chambers employed in the fabrication of semiconductor devices.

BACKGROUND OF THE INVENTION

Manufacture of semiconductor devices such as liquid crystal displays, flat panel displays, and thin film transistors involves use of processing chambers in which various processes are carried out. Many of these processes can result in accumulation of material on chamber surfaces as a by-product of processes in which material is deposited on a substrate in layers (as by chemical vapor deposition (CVD), physical vapor deposition (PVD), thermal evaporation, etc.), or in which material is etched from substrate surfaces. The accumulated material can crumble from chamber surfaces and cause contamination of the sensitive devices being processed in the chamber. Accordingly, processing chambers must be cleaned of accumulated materials frequently, such as after processing of each substrate or of several substrates. To clean the chamber surfaces of a processing chamber, it is known to provide a cleaning gas such as $NF_3$, to dissociate the cleaning gas to form a reactive gas species (e.g., fluorine ions and radicals) and to flow the gas including the reactive gas species into the processing chamber. The reactive species clean the chamber surfaces by forming volatile compounds with the material accumulated on those surfaces. The volatile reaction products and unused reactive species are exhausted from the chamber by a conventional exhaust pump.

Unfortunately, such chamber cleaning processes conventionally consume considerable quantities of cleaning gases, and also produce undesirable by-products such as hazardous air pollutants (HAPs) and perfluorocompounds (PFCs), which are greenhouse gases that may contribute to global warming. Accordingly, it would be desirable to provide improved processing chamber cleaning methods which reduce consumption of cleaning gases and emission of undesirable products.

SUMMARY OF THE INVENTION

In accordance with at least one embodiment of the present invention, a novel method of cleaning a processing chamber is provided. The novel method includes flowing a cleaning gas to an inlet of the processing chamber, exposing surfaces of the processing chamber to the cleaning gas to clean the surfaces, thereby producing a reaction product, removing an outlet gas including the reaction product from an outlet of the processing chamber, separating at least a portion of the reaction product from the removed outlet gas, and recirculating a portion of the outlet gas to the inlet of the processing chamber.

According to another embodiment of the present invention, a novel processing system is provided. The novel processing system includes a processing chamber having an inlet and an outlet, a reactive species generator adapted to dissociate a cleaning gas to generate a reactive species and to supply the reactive species to the inlet of the processing chamber, and a recirculation path adapted to recirculate an outlet gas from the outlet of the processing chamber toward the inlet of the processing chamber. The recirculation path includes a separation mechanism adapted to separate at least a portion of a reaction product from the outlet gas, the reaction product having been formed by reaction of the reactive species with material on surfaces of the processing chamber.

According to another embodiment of the invention, a novel processing system includes a processing chamber having an inlet and an outlet; a remote plasma source having an inlet and having an outlet coupled to the inlet of the processing chamber; a first valve having an outlet coupled to the inlet of the remote plasma source, and also having a first inlet and a second inlet; a flow controller having an inlet adapted to couple to a cleaning gas source and having an outlet coupled to the first inlet of the first valve; a second valve having an inlet coupled to the outlet of the processing chamber, and also having a first outlet adapted to couple to an exhaust path and having a second outlet; a recirculation pump having an inlet coupled to the second outlet of the second valve and also having an outlet; a separation unit having an inlet coupled to the outlet of the recirculation pump, and also having an outlet (the separation unit also being adapted to separate a reaction product from a gas flowed to the separation unit); a filtering mechanism having an inlet coupled to the outlet of the separation unit, and also having an outlet (the filtering mechanism being adapted to filter particles from a gas flowed to the filtering mechanism); and a pressure adjustment mechanism having an inlet coupled to the outlet of the filtering mechanism and an outlet coupled to the second inlet of the first valve, the pressure adjustment mechanism being adapted to adjust a pressure level of a gas flowed to the pressure adjustment mechanism.

In accordance with another embodiment of the invention, a novel method of cleaning a processing chamber includes blending a cleaning gas with a first outlet gas stream recirculated from an outlet of the processing chamber, flowing the blended gas to an inlet of the processing chamber, and, simultaneously with the blending step, dividing an outlet gas flowing from an outlet of the processing chamber into the first outletgas stream for recirculation and blending with the cleaning gas, and into a second outlet gas stream to be exhausted.

Methods and apparatus provided in accordance with the present invention allow a gas which flows from a processing chamber (an outlet gas) during a cleaning operation to be recirculated by separating out reaction products from the outlet gas. Because the outlet gas is recirculated and useful species are reused for cleaning, the total consumption of cleaning gas and the amount of undesirable emissions are reduced. Accordingly, the present invention may reduce the overall cost, both economic and environmental, of semiconductor device manufacturing.

Other features and advantages of the present invention will become more fully apparent from the following detailed description, the appended claims and the accompanying drawings.

DETAILED DESCRIPTION

Embodiments of a processing chamber cleaning system provided in accordance with the invention will now be described with reference to the drawings. In all of the embodiments, a recirculation path is provided to recirculate at least a portion of a gas flowing from an outlet of the processing chamber to an inlet of the processing chamber. In this way, reactive species that pass through the processing chamber without reacting with material accumulated on chamber surfaces may be reused, leading to more efficient use of cleaning gas and reduced emission of undesirable products.

First Embodiment

Figure 1:
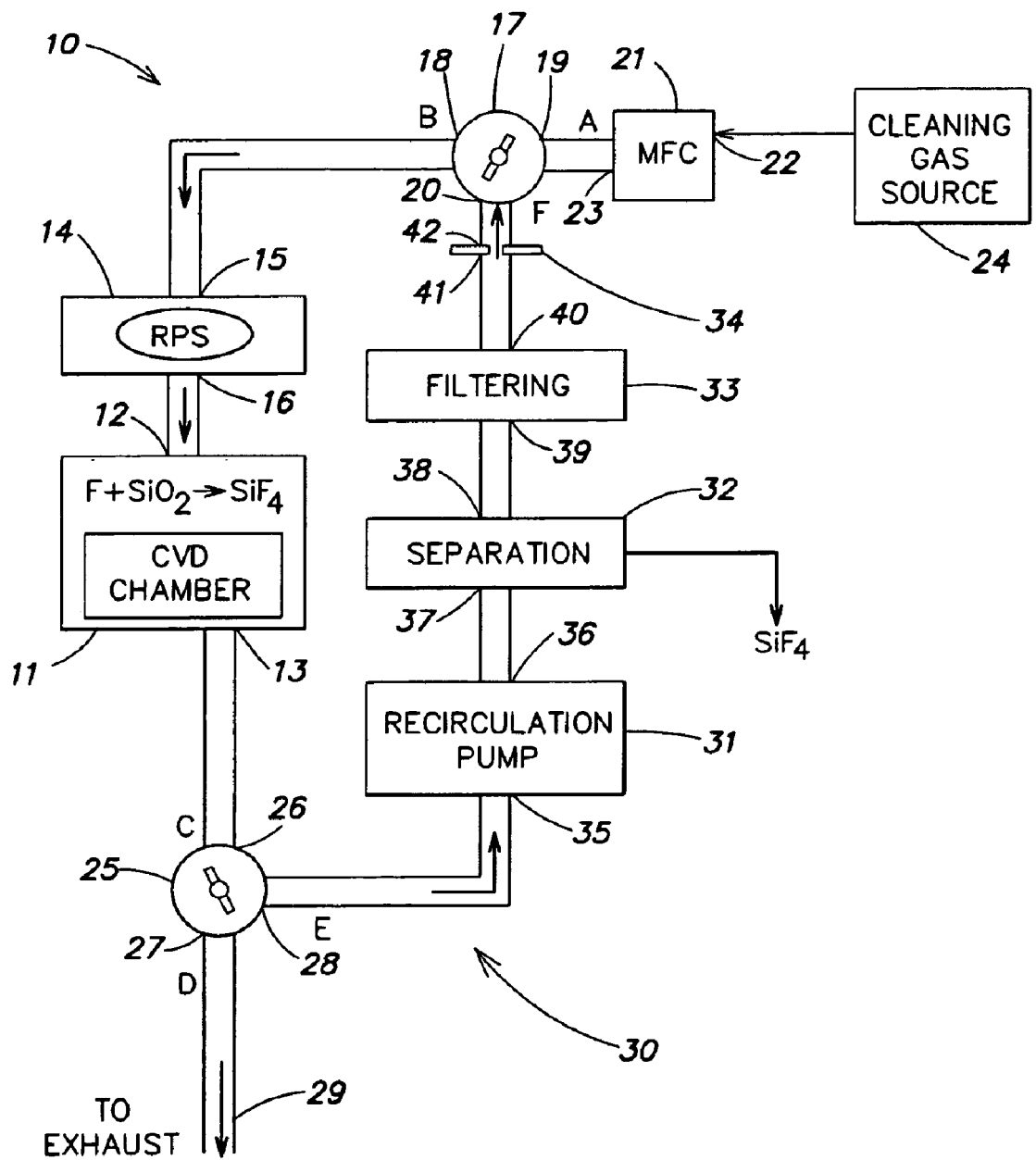
FIG. 1 is a schematic block diagram of a processing chamber cleaning system provided in accordance with a first embodiment of the present invention.

FIG. 1 is a schematic block diagram of a cleaning system 10 provided in accordance with a first embodiment of the invention. The cleaning system 10 includes a processing chamber 11 which is to be cleaned by the system 10. The processing chamber 11 includes an inlet 12 and an outlet 13. The processing chamber 11 may be any one of a number of different types of processing chambers used to perform various processes for fabrication of semiconductor devices. For example, the processing chamber 11 may be of a type used to carry out chemical vapor deposition or other types of semiconductor device fabrication processes. For example, the processing chamber 11 may be a deposition chamber such as an xZ style chamber available from Applied Materials, Inc., the assignee of this application or the Ultima high density plasma chemical vapor deposition (HDPCVD) chamber, also available from Applied Materials, Inc. Alternatively, the processing chamber 11 may be an etching chamber such as the eMax or IPS or DPS chambers, also available from Applied Materials, Inc. ("Ultima", "eMax", "IPS" and "DPS" are trademarks of Applied Materials, Inc.)

Proceeding initially upstream from the processing chamber 11, the system 10 also includes a remote plasma source (RPS) 14. The RPS 14 includes an inlet 15 and an outlet 16 that is coupled to the inlet 12 of the processing chamber 11. The RPS 14 is provided to dissociate a cleaning gas to form a reactive species such as fluorine ions and radicals. The RPS 14 may be, for example, any one of a number of known devices for producing a plasma, including a microwave discharge plasma source, an inductively coupled plasma (ICP) source, a silent barrier discharge (SBD) plasma source, a capacitively coupled plasma source, or a toroidal plasma source.

The system 10 also includes a first valve (e.g., a first three-way throttle valve 17 or some other suitable valve). The three-way throttle valve 17 includes an outlet 18 that is coupled to the inlet 15 of the RPS 14. The three-way throttle valve 17 also has a first inlet 19 and a second inlet 20.

The system 10 also includes a flow controller (e.g., a mass flow controller (MFC) 21 or some other suitable flow controller). The MFC 21 has an inlet 22 and an outlet 23 that is coupled to the first inlet 19 of the three-way throttle valve 17. The MFC 21 controls the flow of gas from a cleaning gas source 24 that is coupled to the inlet 22 of the MFC 21. The cleaning gas provided by the cleaning gas source 24 may be $NF_3$ or other known precursor cleaning gases such as $CF_4$, $C_2F_6$, $CCl_4$, $C_2Cl_6$, $C_3F_8$, $C_4F_8$, $C_4F_8O$, $ClF_3$, $F_2$ and so forth. The MFC 21 may also be connected to a source of process gas, which is not shown.

Proceeding now downstream and in the direction of a recirculation path relative to the processing chamber 11, the system 10 also includes a second valve (e.g., a second three-way throttle valve 25 or some other suitable valve). The second three-way throttle valve 25 includes an inlet 26 that is coupled to the outlet 13 of the processing chamber 11. The second three-way throttle valve 25 also has a first outlet 27 and a second outlet 28. The first outlet 27 of the second three-way throttle valve 25 connects the system 10, and particularly the processing chamber 11, to an exhaust line 29, which is commonly referred to as the "foreline".

The system 10 also includes a recirculation path 30 that extends from the second outlet 28 of the second three-way throttle valve 25 in a direction toward the inlet 12 of the processing chamber 11. Proceeding along the recirculation path 30 the following components are provided: a recirculation pump 31, a separation unit 32, a filtering device 33 and a pressure adjustment device 34.

The recirculation pump 31 has an inlet 35 coupled to the second outlet 28 of the second three-way throttle valve 25. The recirculation pump 31 also has an outlet 36.

The separation unit 32 has an inlet 37 coupled to the outlet 36 of the recirculation pump 31. The separation unit 32 also has an outlet 38.

The filtering device 33 has an inlet 39 coupled to the outlet 38 of the separation unit 32. The filtering device 33 also has an outlet 40.

The pressure adjustment device 34 has an inlet 41 coupled to the outlet 40 of the filtering device 33. The pressure adjustment device 34 also has an outlet 42 that is coupled to the second inlet 20 of the first three-way throttle valve 17.

The recirculation pump 31 is employed to generate a gas flow along the recirculation path 30 and to compensate for a difference in pressure between the processing chamber 11 and the recirculation path 30. A typical pressure for the RPS 14 is in the range of 2–20 torr, and a pressure in the range of 2–5 torr may be employed during cleaning in the processing chamber 11. Typically, the pressure at the foreline 29 is on the order of 1 torr. On the other hand, substantially higher pressures are likely to be desirable in the components of the recirculation path 30 in order to provide the recirculation path 30 in a limited amount of space. For example, pressure at the separation unit 32, which as described below may be a cryogenic unit, may be on the order of 100 to 600 torr. It is desirable that the gas pressure in the recirculation path 30 be kept sub-atmospheric for safety reasons.

The separation unit 32 is provided to remove a reaction product such as $SiF_4$ from the gas which flows through the recirculation path 30 from the outlet 13 of the processing, chamber 11. (The term "outlet gas" will sometimes be used to refer to a gas mixture that flows from the outlet 13 of the processing chamber 11.) The separation unit 32 may perform separation by an ultra-sonic method, with a membrane, by adsorption or absorption, by cryogenic separation or by any other known gas separation technique.

Figure 2:
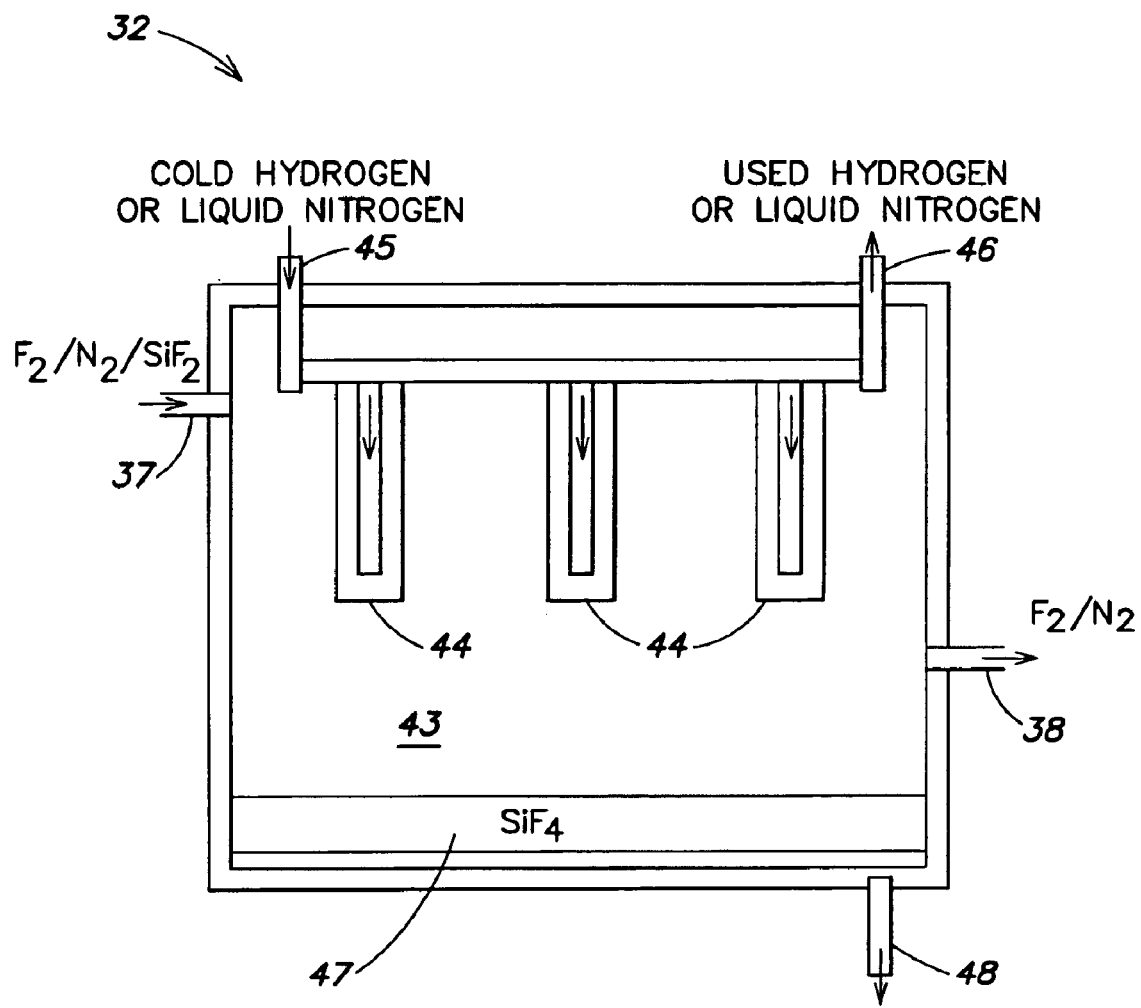
FIG. 2 is a simplified schematic representation of a separation unit that is part of the system of FIG. 1.

FIG. 2 is a schematic illustration of an embodiment of the separation unit 32 as a cryogenic separator. The cryogenic separation unit 32 shown in FIG. 2 takes advantage of the fact that the boiling point of the reaction product to be separated (e.g., $SiF_4$) is typically much higher (e.g., –65° C. at atmospheric pressure) than the boiling point of the valuable species to be recycled (e.g., $F_2$, which has a boiling point at atmospheric pressure of –188° C.). Cooling provided by liquid nitrogen or another cryogenic gas is used to condense the reaction product from the outlet gas (while maintaining the species to be recycled in a gas phase).

The cryogenic separation unit 32 includes a condensation chamber 43 in which cooling and condensation of the reaction product occurs. Cooling fins 44 extend into the condensation chamber 43. Cold hydrogen or liquid nitrogen is supplied to the cooling fins 44 via a supply line 45. Used hydrogen or liquid nitrogen is taken away from the separation unit 32 via an outlet line 46. Condensed reaction product 47 is taken out from the separation unit 32 via a separation outlet 48.

In addition to or instead of cooling the cryogenic separation unit 32 by a coolant such as liquid nitrogen or cold hydrogen, it is also contemplated to use other cooling, techniques, including a compression-expansion cycle.

The filtering device 33 is provided to prevent the processing chamber 11 from being contaminated during the cleaning process by particles carried by the recirculated outlet gas. The filtering device 33 may be a mechanical filter constructed in accordance with conventional techniques, and/or may include an electrostatic trapping device that may be one or more of the types disclosed in commonly-assigned U.S. Pat. No. 6,045,618. The latter patent is incorporated by reference herein in its entirety.

The pressure adjustment device 34 adjusts the pressure of the recirculated outlet gas to substantially match the pressure in the remote plasma source 14. This is necessary because of the relatively high pressure at which the recirculation path 30 operates, and notwithstanding a degree of reduction in pressure along the course of the components of the recirculation path 30. The pressure adjustment device 34 may be a mass flow controller or an orifice of appropriate size, which adjusts pressure by limiting flow of gas therethrough.

The recirculation path 30 and its constituent components are designed to resist corrosion (e.g., from fluorine and/or from other cleaning species if such species are employed) and to prevent generation of particles. This is done by selection of suitable materials for the recirculation path 30 and its components and appropriate design of any mechanical devices. Such selection of materials and design of devices is well within the abilities of those who are skilled in the art.

As indicated in FIG. 1, the first three-way throttle valve 17 operates so as to selectively allow gas flow from a path from point A to point B (i.e., from the MFC 21 to the RPS 14) and/or along a path from point F to point B (i.e. from the recirculation path. 30 to the RPS 14).

Also, the second three-way throttle valve 25 selectively permits flow of gas along a path from point C to point D (i.e., from the processing chamber 11 to the foreline 29) and/or along a path from point C to point E (i.e., from the processing chamber 11 to the recirculation path 30).

Although not shown in the drawings, the cleaning and processing systems illustrated herein also preferably include suitable control circuitry, and signal path connections between the control circuitry and controllable components of the systems.

In operation, the processing system of FIG. 1 is operated in a plurality of different modes at different times.

With reference to FIG. 1, in a film deposition mode, a deposition process gas is injected into inlet 12 of chamber 11 from a deposition process gas source which is not shown. For example, paths AB and CD may be opened and paths CE and FB closed, and a process gas or gases may be flowed through MFC 21 and into processing chamber 11 for the purpose of performing deposition or another process with respect to a substrate in the processing chamber 11. Excess process gases and any by-products of the process are exhausted via foreline 29.

During the film deposition mode, the recirculation path 30 is cut off from the balance of the system 10, but certain preparatory actions may be performed therein. For example, there may be evaporation and removal of condensed reaction products that have accumulated during a previous operation in a cleaning mode. Furthermore, the recirculation path 30 may be depressurized to exhaust residual products of a cleaning operation. Also, the separation unit 32 may be heated, assuming that the same operates by adsorption or according to the cryogenic method referred to in connection with FIG. 2, and/or pressure may be lowered in order to ensure complete removal of liquid and solid residual materials.

After one or more film deposition operations in the processing chamber 11, the system is operated in a cleaning mode.

During at least a portion of the cleaning mode, paths FB and CE are both open, to permit recirculation of outlet gas and reuse of useful species that have not been consumed in the cleaning operation. As will be seen, the throttle valves 17 and 25 assume different configurations at various times during the cleaning operation.

Path AB is open during at least an initial stage of the cleaning mode to permit cleaning gas to flow from the cleaning gas source 24 to the RPS 14 via the MFC 21. At the RPS 14 the cleaning gas is dissociated to generate reactive species, such as fluorine ions and radicals. The dissociated cleaning gas then flows to the processing chamber 11, at which it cleans accumulated material from surfaces of the processing chamber 11 by reacting with the accumulated materials to form reaction products (e.g., $SiF_4$).

In one mode of carrying out the cleaning operation in accordance with the invention, path CD is closed and paths CE and FB are opened from the beginning of the cleaning operation. In this case, there is 100% recirculation of cleaning species and the unreacted cleaning species (e.g., fluorine) is not exhausted at all but rather recirculates until the cleaning operation is complete.

During recirculation of the outlet gas, the recirculation pump 31 operates to flow the outlet gas through the recirculation path 30 and to compress the outlet gas. The reaction product is separated from the outlet gas at the separation unit 32. As noted above, this may be performed by a cryogenic separation process in which the reaction product is condensed out of the outlet gas. At the filtering device 33 particulate contaminants are removed, and the outlet gas is pressure-adjusted at the pressure adjustment device 34 for recirculation to the processing chamber 11 via the three-way throttle valve 17.

According to one manner of carrying out the cleaning operation, the path AB may be maintained at least partially open throughout a portion of the cleaning operation. Thus, additional cleaning gas is injected throughout the cleaning operation. Assuming that the MFC 21 maintains a constant flow rate of the incoming cleaning gas, the pressure inside the separation unit 32 will gradually increase at a rate that depends on a ratio of effective volumes of all the units along the paths BCEF relative to the incoming cleaning gas flow rate. If the path FB is closed at the beginning of the cleaning operation, recirculated cleaning species will be accumulated in the recirculation path 30 in the volume between the recirculation pump 31 and point F. When a sufficient amount of cleaning gas has been injected into the system, the path AB can be closed and path FB opened. From this point, the cleaning rate can be maintained from recirculated cleaning species alone.

At the end of the cleaning operation, paths AB and CE may be closed and paths FB and CD may be opened to exhaust the loop BCEF.

As noted above, the path FB can either be open or closed at the beginning of the cleaning operation. If the path FB is open initially, the pressure in the separation unit 32 can be expected to grow, although at a lower rate than if the path FB were closed. If the path FB is open initially, recirculated cleaning species start to participate in the cleaning operation from the very beginning, the rate of injection of the fresh cleaning gas can be smaller, while the duration of time during which the path AB is open can be longer. Because of the use of recirculated cleaning species, the total amount of injected cleaning gas can be significantly smaller than the amount needed for a conventional cleaning operation which does not employ recirculation.

It is also contemplated that the path CD may be open or partially open at the beginning of the cleaning operation, and that this path may be closed or partially closed as the cleaning operation continues. Such an approach may be desirable because the composition of the outlet gas changes as the cleaning operation progresses. Initially, the outlet gas is rich in reaction product and nearly devoid of cleaning species. This state of affairs may last through 20 to 40% of the duration of the cleaning operation. In other words, initially the cleaning operation is highly effective and recirculation is of little importance, so that the path CD can be temporarily open, perhaps partially, to exhaust the outlet gas as it is rich in reaction product. However, as the cleaning operation progresses, and a larger proportion of the surfaces of the processing chamber 11 become clean, the composition of the outlet gas changes from reaction-product-rich to cleaning-species-rich. Nevertheless, the cleaning operation must be continued until the processing chamber 11 is completely clean. During the portion of the operation when the outlet gas is rich in cleaning species, recirculation should be performed, with paths CE and FB open and path CD closed or partially closed.

To the extent that the system 10 is operated with paths AB and CD closed, then the path BCEF is a closed loop and the concentration of cleaning species (e.g., $F_2$) will gradually decrease, while the concentration of other compounds, such as $N_2$, will increase. Absent compensatory measures, the cleaning rate will correspondingly decrease during this time. To prevent such a gradual decrease in cleaning rate, the amount of cleaning species flowing through the processing chamber 11 may be dynamically increased. This can be done by either increasing gas pressure or gas velocity in the processing chamber 11. The system 10 can be operated in any number of ways to compensate for decreasing concentration of cleaning species. For example, the pumping rate of the recirculation pump 31 can be increased and/or the degree to which paths FB and CE are open can be varied. It is also contemplated to at least partially open path AB during at least a portion of the cleaning process and to dynamically adjust the MFC 21 to vary the flow rate of fresh cleaning gas.

It is also noted that the recirculating cleaning system of FIG. 1 provides flexibility that is not present in prior art systems which lack the recirculation path 30. Consequently, it is possible to adjust additional parameters to achieve optimum balance in cleaning time versus consumption of cleaning gas. In a conventional system which lacks recirculation, the pressure in the RPS 14, the mass flow rate provided by MFC 21 and dilution are adjusted to achieve an appropriate trade-off between cleaning time, recombination and consumption of cleaning gas. But the recirculation path 30 provides an additional parameter, which is the ratio of cleaning gas flow through path AB relative to recirculated gas flow through path FB. With the help of this parameter the mass flow rate for the injected cleaning gas and the pressure in the RPS 14 can be independently adjusted without excessive consumption of cleaning gas and without prolonging the cleaning time.

Another adjustable parameter is the pumping rate of the recirculation pump 31. This pumping rate can be varied dynamically during the pumping cycle to dynamically control the recirculation rate, which is the rate at which recirculated outlet gas is sent back to the processing chamber 11. Thus, the recirculation pump 31 is operated at a first pumping rate during a first portion of a cleaning cycle and is operated at a second pumping rate, different from the first pumping rate, during a second portion of a cleaning cycle. For example, the pumping rate may be increased (e.g., continuously, in discrete steps, etc.) during cleaning to increase recirculation and to compensate for decreasing concentration of cleaning species as cleaning progresses.

The overall performance of the cleaning system 10 of the present invention depends on gas velocity and pressure in the RPS 14 and the processing chamber 11. These parameters can be controlled, for example, by varying the pumping speed of the recirculation pump 31, the degree of mixing of fresh cleaning gas and recirculated gas at the three-way throttle valve 17 and/or recirculation rate, by appropriate selection of the volumes of the separation unit 32 and the filtering device 33, and through operation of the MFC 21.

Thus the cleaning system 10 with recirculation of unused cleaning species is advantageous in a number of respects. The total amount of cleaning gas required as an input for the cleaning operation is reduced, and PFC consumption and HAPs emissions are reduced, due to the recycling of cleaning species and increased efficiency of utilization of cleaning species. Moreover, the system is adjustable in a number of ways that are not possible with prior art cleaning systems, thereby allowing more optimal tradeoffs between cleaning cycle duration and consumption of cleaning gas.

As indicated above, the processing chamber 11 may include a mechanism for generating a plasma in situ. In such a case, it is contemplated to omit the remote plasma source 14. Thus, it is contemplated to dissociate the cleaning gas and/or cleaning components of outlet gas only remotely from the processing chamber 11, or only in situ within the processing chamber 11, or in both locations.

As an alternative to, or in addition to, separating the reaction product (e.g., $SiF_4$) from the outlet gas at the separation unit 32, it is also contemplated to keep the plasma provided to the processing chamber 11 cleaning species rich (e.g., fluorine rich) by simultaneously injecting small amounts of fresh cleaning gas into the system while pumping away a small portion of the outlet gas. In this way, decomposition of the reaction product during recirculation can be prevented (e.g., decomposition of $SiF_4$ into solid silicon during recirculation can be prevented). Plasma parameters may also be controlled to prevent decomposition of reaction product. If such approaches are used, the separation unit 32 may be omitted. Assuming such an alternative (or additional) approach is employed, in at least one embodiment paths AB, FB, CD and CE are all open simultaneously, although paths AB and CD may only be open to a limited degree. Consequently the three-way throttle valve 25 divides the outlet gas from the processing chamber 11 into a first stream that is to be recirculated and into a second stream that is exhausted. At the same time the three-way throttle valve 17 blends the recirculated first stream of outlet gas with fresh cleaning gas.

Second Embodiment

Figure 3:
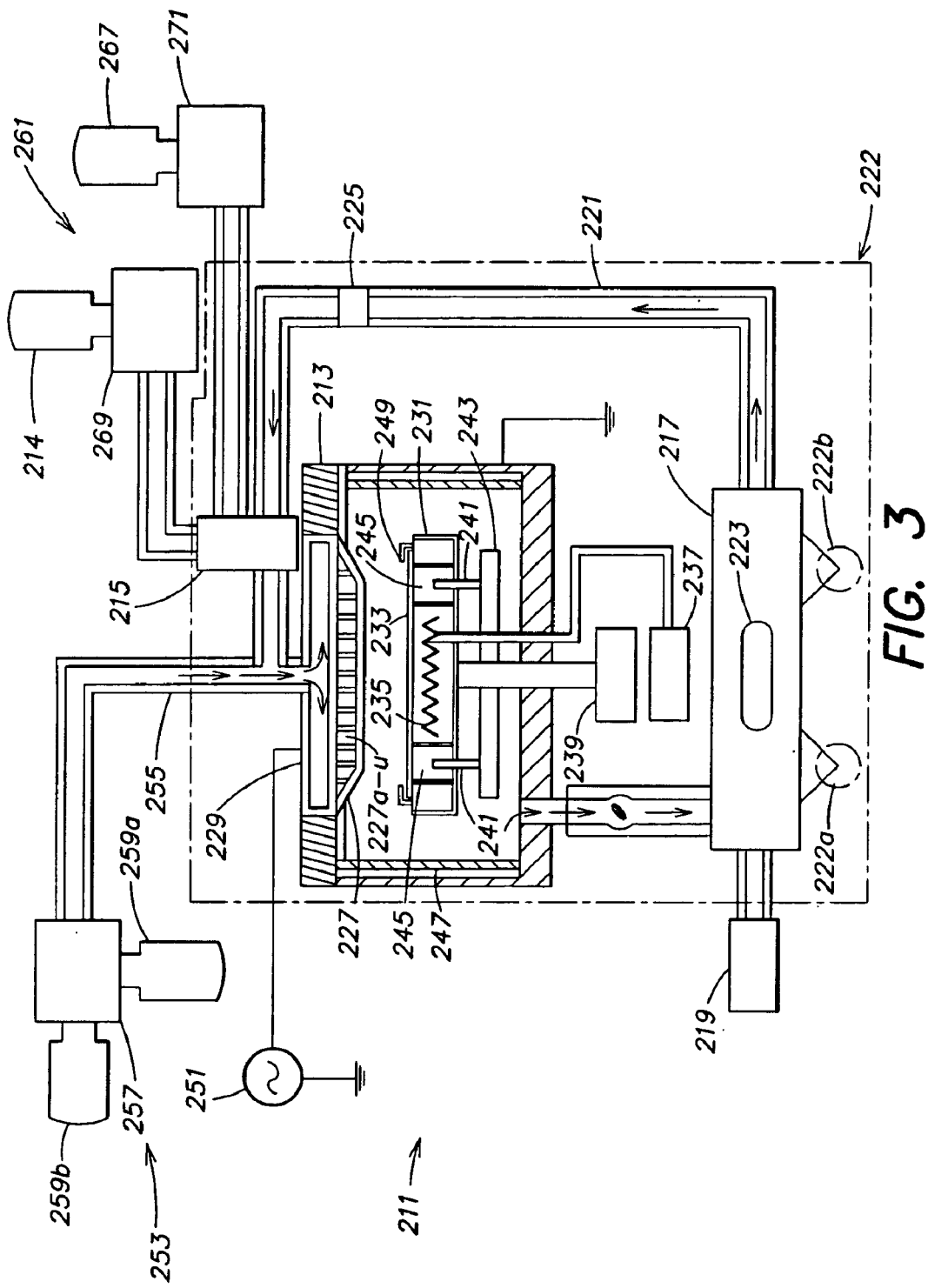
FIG. 3 is a diagramatic side view of an inventive processing system that represents a second embodiment of the invention.

FIG. 3 is a diagramatic side view showing a second embodiment of the inventive cleaning system.

Referring to FIG. 3, reference numeral 211 generally indicates a substrate processing system. The processing system 211 includes a processing chamber 213 coupled to a source of precursor gas 214 (e.g., a source of $NF_3$) via a remote plasma source 215 and coupled to a pump 217 (e.g., a mechanical pump, a turbo-molecular pump, etc.). Pump 217 is coupled to a main exhaust 219 (e.g., an exhaust used by a plurality of processing chambers such as a main exhaust of a clean room), and a recirculation line 221 is coupled between the pump 217 and the remote plasma source 215. The pump 217 is positioned adjacent the deposition chamber 213 to reduce recombination of at least one reactive species (e.g., F) when the reactive species travels from the processing chamber 213 to the pump 217, and the recirculation line 221 is also configured so as to have a relatively short length (e.g., to reduce recombination of at least one reactive species when the reactive species travels from the pump 217 to the remote plasma source 215 and/or to the processing chamber 213).

In general, it is desirable that the recirculation loop be as short as possible to minimize the residence time for reactive species, thereby minimizing recombination. Furthermore it is desirable to adjust the pumping rate of the pump 217 to increase the recirculation flow so that the number of trips through the loop made by reactive species is increased, thereby maximizing the likelihood that the reactive species will participate in the cleaning reaction.

The pump 217 and/or the recirculation line 221 may employ an ultrasonic module 223 and/or a particle filtering device 225 to reduce the recycling of reaction products/contaminants as previously described.

In at least one embodiment of the invention, the processing chamber 213, the remote plasma chamber 215, the pump 217 and the recirculation line 221 may form a modular unit 222 (as shown in phantom). Additionally, the pump 217 and/or the recirculation line 221 may be positioned above or below the processing chamber 213 so that the footprint of the system is minimized. The modular unit 222 may be mobile (e.g., as represented by wheels 222a–b shown in phantom) and/or retrofittable. (To aid in convenient retrofitting, a compact recirculation path unit may be formed, including, for example, the following components of the embodiment of FIG. 3: pump 217, recirculation line 221, ultrasonic module 223 and particle filtering device 225. Similarly, in the embodiment of FIG. 1, the processing chamber 13, the remote plasma source 15, the throttle valve 25, the recirculation pump 31, the separation unit 32, the filtering device 33, the pressure adjustment device 34 and the throttle valve 17 may form a modular and/or mobile unit. To aid in convenient retrofitting, a compact recirculation path unit may be formed, including, for example, the following components of the embodiment of FIG. 1: throttle valve 25, recirculation pump 31, separation unit 32, filtering device 33, pressure adjustment device 34, and throttle valve 17.)

Exemplary processing systems on which the processing system 211 may be based include a DxZ chamber manufactured by Applied Materials, Inc., a model AKT-1600 PECVD system manufactured by AKT, Inc. and described in U.S. Pat. No. 5,788,778, a GIGAFILL™ processing system manufactured by Applied Materials, Inc. and described in U.S. Pat. No. 5,812,403, and an Ultima HDPCVD chamber manufactured by Applied Materials, Inc. These patents are hereby incorporated by reference herein in their entirety.

The processing chamber 213 includes a gas distribution plate 227 with apertures 227a–u and a backing plate 229 for delivering processing gases and cleaning gases into the processing chamber 213, and a susceptor 231 for supporting a substrate 233 to be processed within the processing chamber 213. The susceptor 231 includes a heater element 235 (e.g., a resistive heater) coupled to a heater control 237 for elevating the temperature of the substrate 233 to a processing temperature and for maintaining the substrate 233 at the processing temperature during processing.

A lift mechanism 239 is coupled to the susceptor 231 to allow the substrate 233 to be lifted from the susceptor 231, as described below. Specifically, a plurality of lift pins 241 (fixedly held by a lift pin holder 243) penetrate the susceptor 231 (through a plurality of lift pin apertures 245) so as to contact and lift the substrate 233 from the susceptor 231 when the susceptor 231 is lowered by the lift mechanism 239. The processing chamber 213 further includes a chamber wall liner 247 which blocks material from accumulating on the walls of the chamber 213, and a shadow frame 249 which overhangs the edge of the substrate 233 and thereby prevents material from depositing or accumulating on the edge of the substrate 233.

In addition to their above described functions, the gas distribution plate 227 and the susceptor 231 also serve as parallel plate upper and lower electrodes, respectively, for generating a plasma within the processing chamber 213. For example, the susceptor 231 may be grounded and the gas distribution plate 227 coupled to an RF generator 251. An RF plasma thereby may be generated between the gas distribution plate 227 and the susceptor 231 through application of RF power supplied thereto by the RF generator 251.

The processing system 211 further includes a first gas supply system 253 coupled to an inlet 255 of the processing chamber 213 for supplying processing gases thereto through the backing plate 229 and the gas distribution plate 227. The first gas supply system 253 includes a valve controller system 257 (e.g., computer controlled mass flow controllers, flow meters, etc.) coupled to the inlet 255 of the processing chamber 213, and a plurality of process gas sources 259a, 259b coupled to the valve controller system 257. The valve controller system 257 regulates the flow of processing gases to the processing chamber 213. The specific processing gases employed depend on the materials being deposited within the processing chamber 213.

In addition to the first gas supply system 253, the processing system 211 includes a second gas supply system 261 coupled to the inlet 255 of the processing chamber 213 (via the remote plasma source 215) for supplying cleaning gases thereto during cleaning of the processing chamber 213 (e.g., to remove accumulated material from the various interior surfaces of the chamber 213). The second gas supply system 261 includes the precursor gas source 214 and a carrier gas source 267 coupled to the remote plasma source 215 via a valve controller system 269 and a valve controller system 271, respectively. Typical precursor cleaning gases include $NF_3$, $CF_4$, $SF_6$, $C_2F_6$, $C_3F_8$, $C_4F_8$, $C_4F_8O$, $F_2$, HF, $CCl_4$, $C_2Cl_6$, $ClF_3$, etc. as are well known in the art. The carrier gas, if employed, may include any gas compatible with the cleaning process being employed (e.g., argon, helium, hydrogen, nitrogen, oxygen, etc.). The precursor and carrier gas sources 214, 267 may comprise a single gas source if desired containing an appropriate mixture of the precursor and carrier gases.

Note that in the processing system 211 of FIG. 3, the amount of outlet gas recirculated from the outlet of the chamber 213 may be controlled by the pump 217 (rather than by throttle valves such as the first throttle valve 17 and the second throttle valve 25 of FIG. 2). As within the system 10 of FIG. 1, in the processing system 211 of FIG. 3, the flow of new cleaning gas into the chamber 213 also may be controlled independently of the flow of recirculated gas (through use of the valve controller system 269).

Third Embodiment

Figure 4:
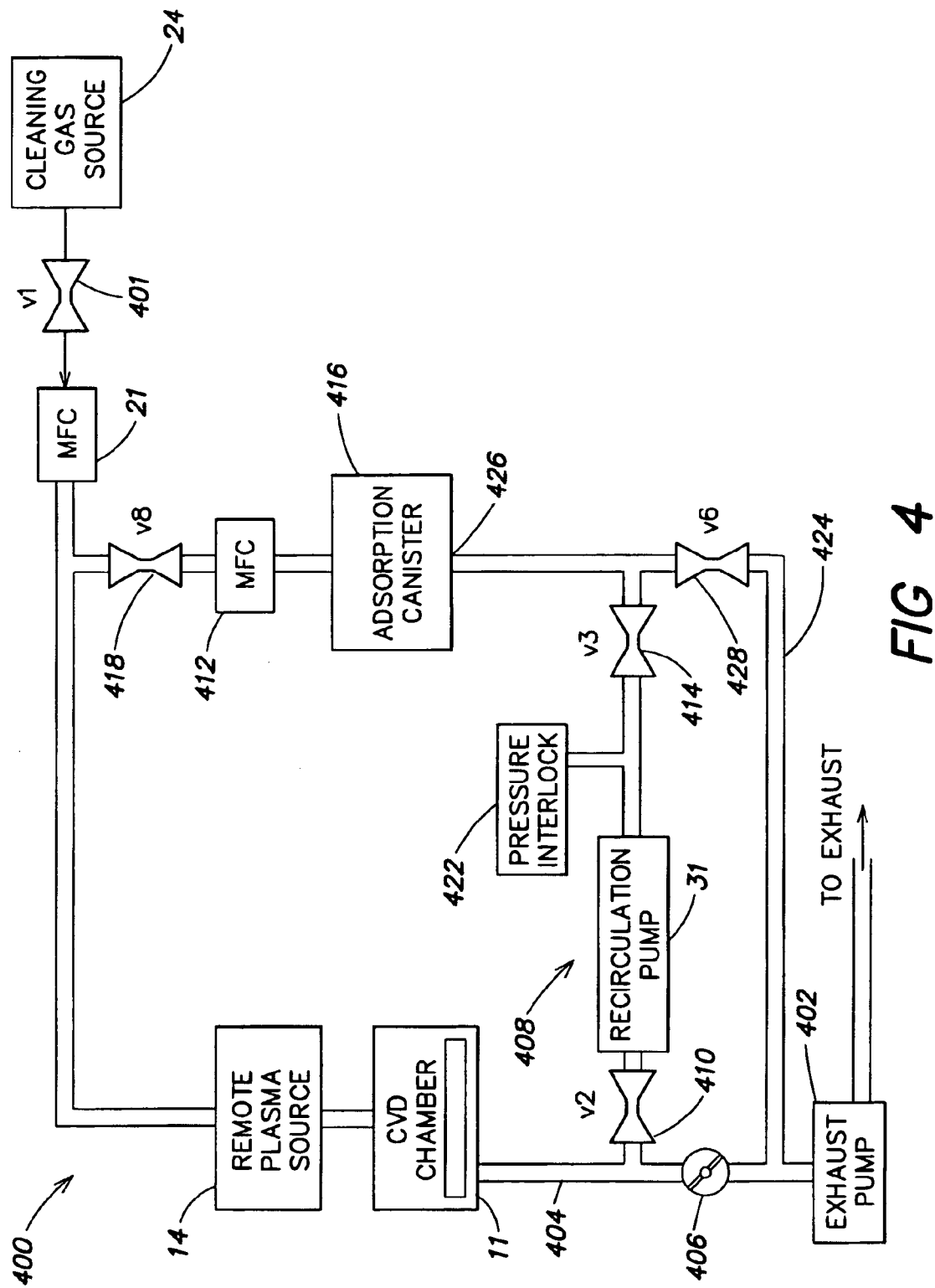
FIG. 4 is a schematic block diagram of a processing chamber cleaning system provided in accordance with a third embodiment of the invention.

FIG. 4 is a schematic block diagram that illustrates a cleaning system 400 provided in accordance with a third embodiment of the invention. Elements that this embodiment shares with the embodiment of FIG. 1 are labeled with the same reference numerals as in FIG. 1.

The system 400 includes a processing chamber 11. Upstream from the processing chamber 11 are a remote plasma source 14, a mass flow controller 21, a valve 401 and a cleaning gas source 24. Downstream from the processing chamber 11 is an exhaust pump 402. A conduit 404 connecting an outlet of the processing chamber 11 with the exhaust pump 402 is controlled by a throttle valve 406.

Branching off from conduit 404 is a recirculation path 408. The recirculation path 408 includes a valve 410, recirculation pump 31, a valve 414, an adsorption canister 416, a mass flow controller (MFC) 412, and a valve 418. A pressure interlock 422 is installed in the recirculation path 408 between the recirculation pump 31 and the MFC 412.

A desorption line 424 connects an inlet 426 of adsorption canister 416 with the exhaust pump 402. A valve 428 controls the desorption line 424.

The various modes of operation described in connection with the embodiment of FIG. 1 are also generally applicable to the embodiment of FIG. 4. The adsorption canister 416 is provided to perform the function of the separation unit 32 referred to in connection with FIG. 1. More specifically, the adsorption canister 416, during a cleaning operation, separates the reaction product (e.g., $SiF_4$) from the recirculated gas flowing through the recirculation path 408. The separation is performed by adsorption using a suitable adsorption material such as granules of fluorinated graphite. Between cleaning operations, valves 410, 414, and 418 are closed and valve 428 is opened so that the adsorption canister 416 is pumped out by exhaust pump 402 via desorption line 424, thereby desorbing the reaction product from the adsorption material in the adsorption canister 416. By desorbing the reaction product from the adsorption canister 416, the adsorption canister 416 is prepared for the next cleaning cycle.

The MFC 412 is employed in place of the pressure adjustment device 34 of FIG. 1, performing a similar function but in a more controllable manner. The valves 401, 410, 414, 418 and 428 may comprise conventional on/off valves compatible with the chemistries being employed (e.g., stainless steel, nickel, teflon-coated, etc., valves).

The pressure interlock 422 performs a safety function by preventing excessive pressurization of the recirculation path 408. In one embodiment of the invention, if the pressure in the recirculation path 408 reaches a level of 550 torr, the pressure interlock 422 is triggered. Other triggering pressure levels may be employed. Upon triggering of the pressure interlock 422, gas flow is stopped while exhaust pumping continues.

Although not shown in FIG. 4, a filtering device like filtering device 33 (FIG. 1) may also be included in the recirculation path 408 shown in FIG. 4.

An additional valve (not shown) may be provided in series with valve 418 as a safety measure if a potentially explosive deposition process gas such as silane is used, to help assure that the deposition process gas is kept separated from any residual cleaning gas in the recirculation path 408.

Fourth Embodiment

Figure 5:
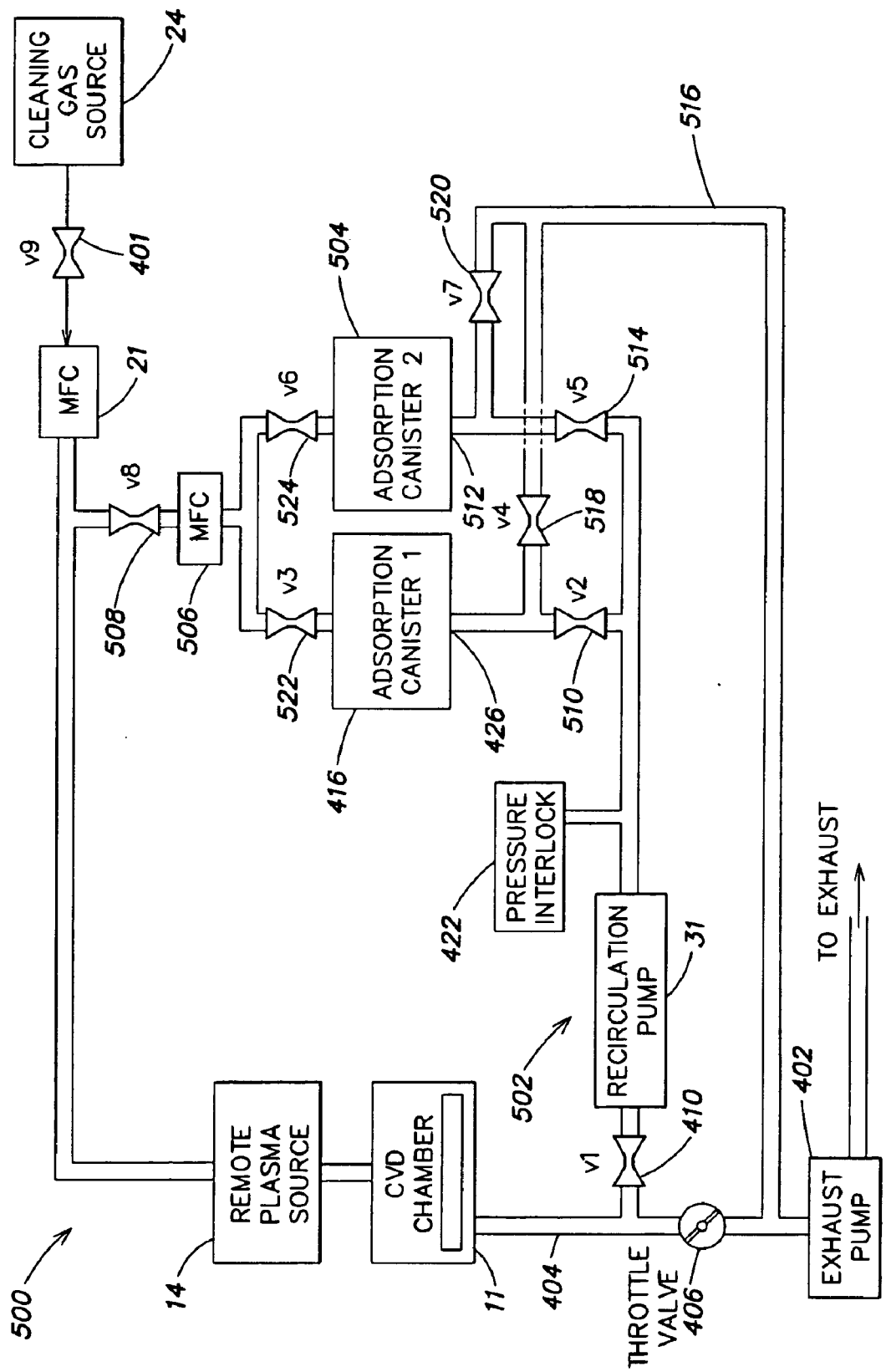
FIG. 5 is a schematic block diagram of a processing chamber cleaning system provided in accordance with a fourth embodiment of the invention.

FIG. 5 is a block diagram of a cleaning system 500 provided in accordance with a fourth embodiment of the invention. The principal difference between the embodiment of FIG. 5 and the embodiment of FIG. 4 is that in the embodiment of FIG. 5 dual adsorption canisters are provided in parallel in the recirculation path in place of the single adsorption canister 416 shown in FIG. 4. Elements of the embodiment of FIG. 5 which are the same as elements of the embodiment of FIG. 4 are labeled with the same reference numerals.

Since only the recirculation path and the desorption line in the embodiment of FIG. 5 are different from the corresponding elements of the embodiment of FIG. 4, only the recirculation path and the desorption line in the embodiment of FIG. 5 will be described.

In FIG. 5 a recirculation path 502 includes the valve 410, the recirculation pump 31, the pressure interlock 422, a parallel arrangement of the adsorption canister 416 and an adsorption canister 504, a mass flow controller 506 and a valve 508. An inlet 426 of adsorption canister 416 is connected to the recirculation pump 31 via a valve 510. An inlet 512 of adsorption canister 504 is connected to the recirculation pump 31 via a valve 514. Inlet 426 of adsorption canister 416 is connected to a desorption line 516 via a valve 518. Inlet 512 of adsorption canister 504 is connected to desorption line 516 via a valve 520. Valves 522 and 524 respectively connect outlets of adsorption canisters 416 and 504 with MFC 506.

The embodiment of FIG. 5 calls for the provision of an additional adsorption canister in case it is not possible to perform sufficient desorption of reaction product from an adsorption canister in the period of time between cleaning cycles. With the arrangement shown in FIG. 5, while one of the adsorption canisters is available for a cleaning operation, the other adsorption canister can be isolated from the recirculation path 502 and continuously desorbed by pumping from the exhaust pump 402 even during a cleaning cycle. When desorption of the canister is complete, it is recoupled to the recirculation path 502 via valves 510 and 522 or valves S14 and 524 and the other canister is taken off line for desorption.

Although not shown, a filtering device like filtering device 33 of FIG. 1 may be included in the recirculation path 502. More than two adsorption canisters may be employed, and two or more adsorption canisters may be employed simultaneously during cleaning. Adsorption canisters may be placed in series and/or in parallel.

Fifth Embodiment

Figure 6A:
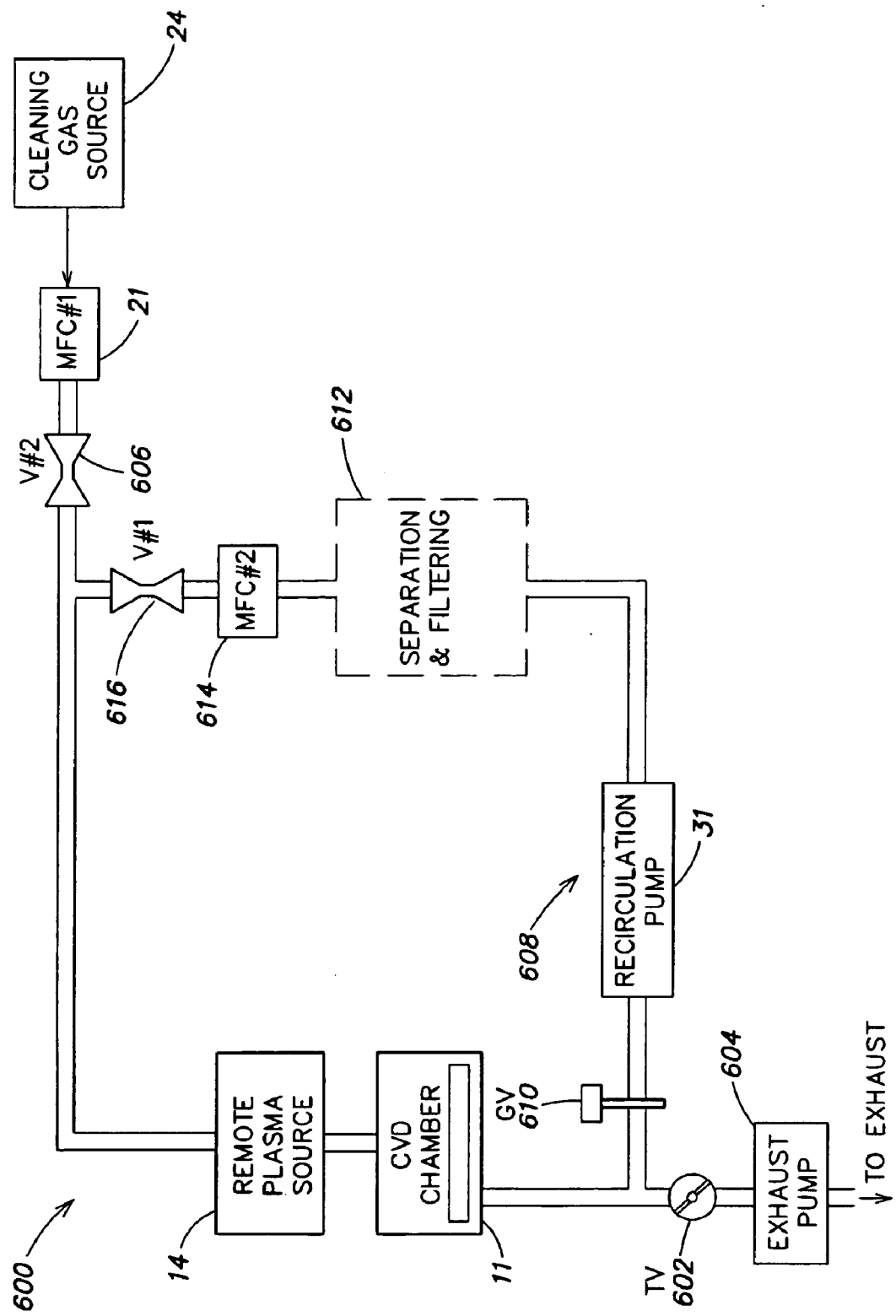
FIG. 6A is a schematic block diagram of a processing chamber cleaning system provided in accordance with a fifth embodiment of the invention.

FIG. 6A is a simplified schematic block diagram of a cleaning system 600 provided in accordance with a fifth embodiment of the invention. Elements of the embodiment of FIG. 6A which are the same as elements of the embodiment of FIG. 1 are labeled with the same reference numerals.

The system 600 of FIG. 6A includes a processing chamber 11. Downstream from the processing chamber 11 are a throttle valve 602 and an exhaust pump 604. Upstream from the processing chamber 11 are a remote plasma source 14, a valve 606, a mass flow controller 21 and a cleaning gas source 24. A recirculation path 608 includes a gate valve 610, a recirculation pump 31, a separation and filtering unit 612, a mass flow controller 614 and a valve 616.

The embodiment of FIG. 6A differs from the embodiment of FIG. 1 principally in that the embodiment of FIG. 6A avoids use of three-way throttle valves. As described further below, throttle valves may be prone to failure and possible sources of contamination.

Applicants constructed an experimental arrangement to simulate the embodiment of FIG. 6A, with a suitable volume replacing the separation and filtering unit 612, and a source of dry gas or nitrogen replacing the cleaning gas source 24. Experiments were performed to determine the effects of the recirculation path 608 on control of pressure and flow of gas in the chamber 11.

With valve 606 and throttle valve 602 open and valve 616 and gate valve 610 closed, a flow of gas through MFC 21 at the rate of 3.0 slm was permitted. The resulting pressure in the processing chamber 11 was 1.7 torr, and the resulting pressure in the remote plasma source 14 was 8.7 torr.

Partial recirculation regimes were then investigated. With all of valves 606 and 616, gate valve 610 and throttle valve 602 open and MFC 614 completely open, a flow of gas through MFC 21 of 1.5 slm was permitted. The resulting flow through MFC 614 was measured at 1.7 slm, resulting in a total flow to the remote plasma source 14 and the chamber 11 of 3.2 slm. The recirculation ratio was 53%, the pressure measured in the processing chamber 11 was 1.0 torr, and the pressure measured in the remote plasma source 14 was 8.8 torr. The pressure measured in the recirculation path 608 was 110 torr.

With the same arrangement of all valves open, except that the throttle valve 602 was partially closed, a gas flow through the MFC 21 of 1.0 slm was permitted. The resulting flow through MFC 614 was 1.9 slm, resulting in a total flow to the remote plasma source 14 and the processing chamber 11 of 2.9 slm. The recirculation ratio therefore was 66%, the measured pressure in the processing chamber was 1.0 torr, the measured pressure in the remote plasma source 14 was 8.2 torr, and the measured pressure in the recirculation path 608 was 123 torr.

These results indicate that with partial recirculation of gases from the outlet of the processing chamber 11 an appropriate level of total flow of cleaning gas, including a contribution of recirculated gas, can be maintained, along with adequate pressure in the remote plasma source 14 and the processing chamber 11, while reducing the amount of cleaning gas consumed by one-half or two-thirds.

Other experiments were performed using a variant of the fifth embodiment of the invention (FIG. 6A). In this experimental arrangement the processing chamber 11 was an SACVD (subatmospheric chemical vapor deposition) chamber in which TEOS (tetraethylorthosilicate) was used as a deposition process gas to deposit USG (undoped silicate glass) on a substrate. Also in this experimental arrangement there was no separation unit 612 included in the recirculation path 608. In the experiments performed with this arrangement, cleaning was performed after deposition of a 600 nm film.

Figure 6B:
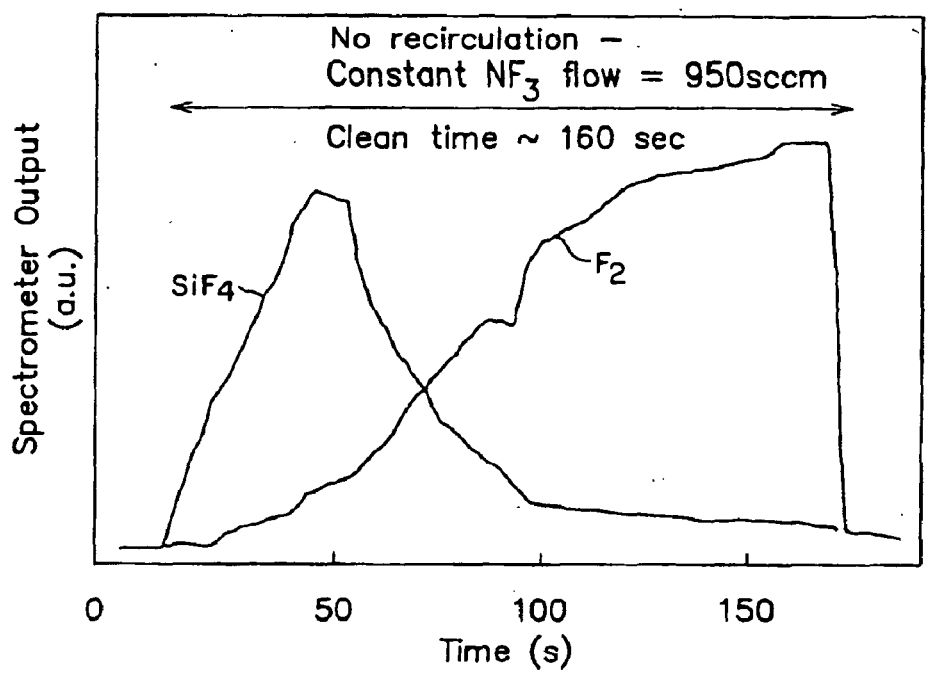
FIGS. 6B and 6C graphically illustrate spectrometer data obtained by experiments using a processing chamber cleaning system that is a variant of the fifth embodiment of the invention.

First a cleaning cycle was performed without recirculation, for a cycle duration of 160 seconds and with a cleaning gas ($NF_3$) flow rate of 950 sccm. For this cleaning cycle traces for $SiF_4$ and $F_2$ were obtained using a quadrapole mass spectrometer (QMS). The resulting data is presented in graphical form in FIG. 6B. The consumption of cleaning gas in this cycle was 2,533 scc (950×160/60).

Figure 6C:
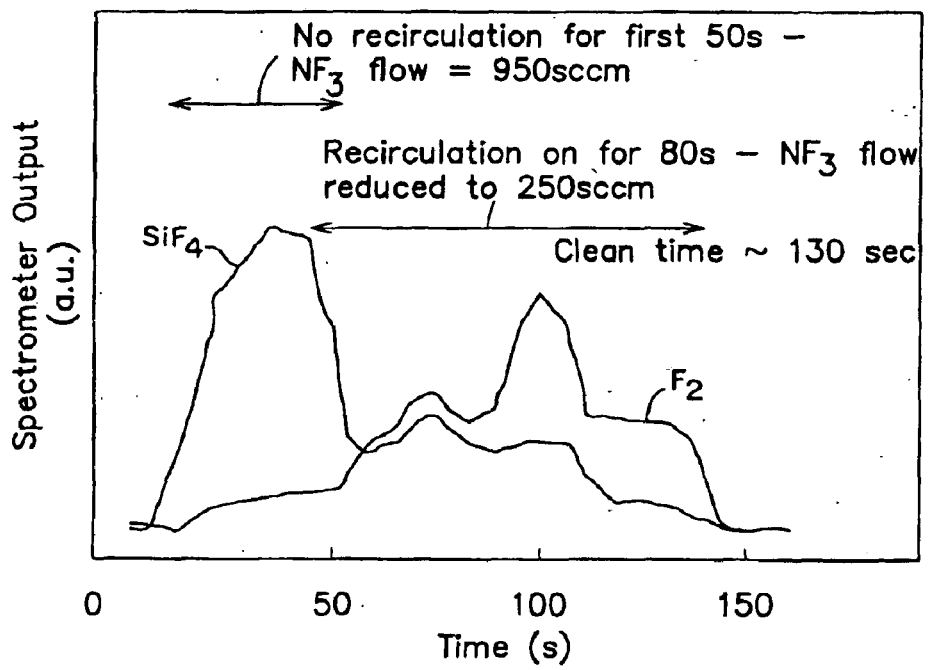

Then, after another deposition cycle, a cleaning cycle was performed using recirculation. For the first 50 seconds of this cycle, the recirculation path 608 was closed and cleaning gas was flowed at the rate of 950 sccm. After the first 50 seconds, the recirculation path 608 was operated (e.g., by opening gate valve 610, MFC 614 and valve 616) and the flow rate for the cleaning gas was reduced to 250 sccm. This continued for 80 seconds. After a total of 130 seconds, cleaning gas flow and plasma generation were stopped and the chamber 11 was flushed with non-recirculating gas (e.g., fresh $NF_3$, $N_2$, Ar, etc.). Another cleaning cycle was run immediately, without recirculation, and no $SiF_4$ emissions were observed, indicating that the cleaning cycle with recirculation had apparently removed Si-containing residues from the chamber 11. The QMS data for the cleaning cycle with recirculation are graphically presented in FIG. 6C.

It appears that the cycle with recirculation resulted in more rapid cleaning than the cycle without recirculation. This may be due, for example, to increased gas velocity through chamber 11 during recirculation. Moreover, the cleaning gas consumption during the cycle with recirculation was only 1,125 scc ((950×50/60)+(250×80/60)), representing a reduction in cleaning gas consumption by a factor of about 2.25 (=2,533/1,125).

Sixth Embodiment

Figure 7:
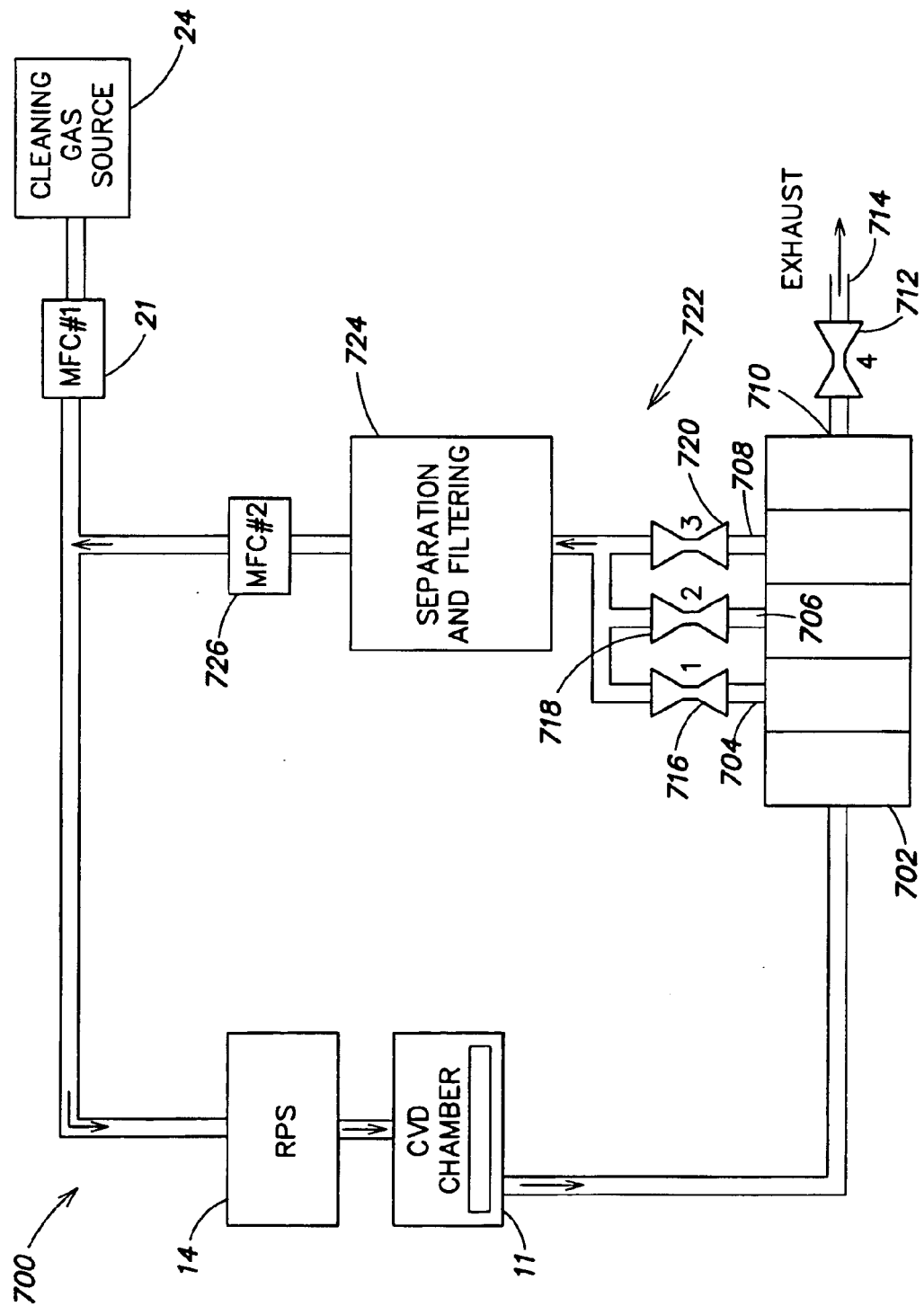
FIG. 7 is a schematic block diagram of a processing chamber cleaning system provided in accordance with a sixth embodiment of the invention.

FIG. 7 is a simplified schematic block diagram of a cleaning system 700 provided in accordance with a sixth embodiment of the invention. Elements of the embodiment of FIG. 7 which are the same as elements of the embodiment of FIG. 1 are labeled with the same reference numerals. A difference between the embodiment of FIG. 7 and that of FIG. 1 is that in the embodiment of FIG. 7 the throttle valves are eliminated entirely. Furthermore, in the embodiment of FIG. 7, a single pump is used both for recirculation and for exhaust.

The cleaning system 700 shown in FIG. 7 includes a processing chamber 11. Upstream from the processing chamber 11 are a remote plasma source 14, a mass flow controller 21 and a cleaning gas source 24. Downstream from the processing chamber 11 is a pump 702. Pump 702 is of a type having multiple stages (e.g., five stages as indicated in FIG. 7). Other numbers of stages may be employed. A number of intermediate stages of the pump 702, such as three, are equipped with ports (e.g., ports 704, 706, 708), which can be used for bypassing subsequent stages of the pump 702. A final outlet 710 of the pump 702 is coupled via a valve 712 to an exhaust line 714.

Ports 704, 706 and 708 of pump 702 are respectively coupled via valves 716, 718 and 720 to a recirculation path 722. The recirculation path 722 includes a separation and filtering unit 724 and a mass flow controller 726.

In one embodiment of the invention, the processing chamber 11 may be a plasma enhanced chemical vapor deposition (PECVD) chamber marketed by Applied Materials, Inc., the assignee of this application, under the trademark DxZ. The remote plasma source 14 may be the Astron model of torroidal plasma source available from Astex, Inc. The MFC's 21 and 726 may be devices available from Unit instruments.

The pump 702 may be an Alcatel model IPUP A100P. Other chambers, plasma sources, MFC's and pumps may be employed.

The embodiment of FIG. 7 is particularly advantageous in that, by eliminating the throttle valves, a possible source of unreliability is eliminated, since throttle valves are mechanical devices that are prone to failure. Moreover, throttle valves are a potential source of impurities and particulate contamination. Furthermore, throttle valves must periodically be cleaned, which requires interruption of use of the substrate processing system and opening of the system to the atmosphere. Thus eliminating the throttle valves overcomes these potential disadvantages.

In addition, the embodiment of FIG. 7 is advantageous in that, by using only one pump instead of two, the reliability of the system may be improved, consumption of energy may be decreased, and the size (footprint) of the system may also be reduced.

On the other hand, the throttle valve as used in conventional wafer processing systems was available for adjustment of the chamber pressure. However, the present inventors have recognized that, particularly with the recirculation arrangement shown in FIG. 7, other techniques are available for controlling chamber pressure. For one, it is contemplated to use the pressure regulation techniques disclosed in U.S. Pat. No. 5,944,049 (issued to Beyer et al. and entitled "Apparatus and Method for Regulating a Pressure in a Chamber") for the purpose of regulating chamber pressure. Briefly, these techniques include bypassing a pump stage, injecting gas into the exhaust side of a pump stage, and varying the rotational frequency of a pump stage. The above-referenced U.S. Pat. No. 5,944,049 patent is incorporated herein by reference in its entirety.

It is also contemplated to control the pressure in the chamber 11 by controlling one or both of the amount of new cleaning gas allowed to flow through MFC 21 and the amount of recirculated gas allowed to flow through MFC 726.

It is contemplated to operate the embodiment of FIG. 7 in a number of different modes including:
(a) steady state with partial recirculation;
(b) steady state with no exhaust; and
(c) with dynamically varying pressure and recirculation rate.

In all three of the enumerated modes, it is possible to achieve satisfactory control of the pressure in the processing chamber 11, notwithstanding the absence of throttle valves.

To operate the embodiment of FIG. 7 in mode (a) a controlled amount of cleaning gas is allowed to flow through MFC 21, and MFC 726 is maintained completely open. Valves 716 and 718 are closed and valves 720 and 712 are open.

In mode (b) MFC 21 is closed, MFC 726 is used to control pressure and gas flow, valves 716, 718 and 712 are closed and valve 720 is open. This mode follows an initial period in which MFC 21 is open to allow a predetermined amount of cleaning gas to enter the system.

In mode (c) valves 716, 718 and 712 are closed and valve 720 is open. MFC 21 is controlled to allow cleaning gas to flow into the system from the cleaning gas source 24. MFC 726 is fully open and does not limit the flow rate of the recirculating gas. By adding new cleaning gas, and allowing chamber pressure to increase, mode (c) compensates for what would otherwise be a gradual dilution of reactive species in the recirculating gas in mode (b). Other modes of operation for the cleaning system 700 may be employed.

To investigate the capabilities of the embodiment of FIG. 7 to control pressure in the processing chamber 11 in the absence of a throttle valve, an experimental arrangement was constructed to emulate the embodiment of FIG. 7. In the experimental arrangement, a suitable volume replaced separation and filtering unit 724, and a source of dry air was used instead of cleaning gas source 24.

Initially, to provide baseline data, valves 716, 718 and 720 were closed and valve 712 was open, to model a prior art apparatus in which no recirculation occurs. The setting of MFC 21 was varied, and the resulting pressure levels in the processing chamber 11 ("$P_{CVD}$") and in the remote plasma source 14 ("$P_{RPS}$") were measured. Table 1 sets forth the results of these measurements.

TABLE 1

| MFC 21, slm | $P_{CVD}$, torr | $P_{RPS}$, torr |
| --- | --- | --- |
| 5.0 | 2.9 | 13.1 |
| 4.5 | 2.6 | 12.0 |
| 4.0 | 2.3 | 10.9 |
| 3.5 | 2.1 | 9.9 |
| 3.0 | 1.8 | 8.8 |
| 2.5 | 1.5 | 7.7 |
| 2.0 | 1.2 | 6.5 |
| 1.5 | 0.9 | 5.3 |
| 1.0 | 0.7 | 4.0 |

It will be observed that higher flow rates of gas through MFC 21 result in higher pressure readings in the processing chamber 11 and in the remote plasma source 14. In a prior art cleaning system that does not use recirculation, a typical flow rate for cleaning gas from a cleaning gas source is 3.0 slm. In the experimental arrangement that emulates the embodiment of FIG. 7, such a flow rate results in a chamber pressure of 1.8 torr and a remote plasma source pressure of 8.8 torr.

Next the experimental arrangement was operated to model mode (a) (steady state with partial recirculation). Valves 716 and 718 were closed and valves 720 and 712 were opened. MFC 726 was opened and did not limit the flow emerging from the recirculation path 722. The flow rate of new gas allowed to flow through MFC 21 was varied, and measurements were taken of the resulting flow through MFC 726, the pressure in processing chamber 11 ($P_{CVD}$) and the pressure in remote plasma source 14 ($P_{RPS}$) The resulting data is set forth in Table 2.

TABLE 2

| MFC 21, slm | MFC 726, slm | $P_{CVD}$, torr | $P_{RPS}$, torr |
| --- | --- | --- | --- |
| 5.0 | 3.14 | 4.7 | 19.2 |
| 4.5 | 3.09 | 4.3 | 18.1 |
| 4.0 | 3.04 | 4.0 | 16.9 |
| 3.5 | 2.97 | 3.7 | 15.8 |
| 3.0 | 2.82 | 3.3 | 14.5 |
| 2.5 | 2.65 | 2.9 | 13.0 |
| 2.0 | 2.55 | 2.6 | 11.0 |
| 1.5 | 2.51 | 2.3 | 10.8 |
| 1.0 | 2.55 | 2.1 | 9.8 |
| 0.5 | 2.55 | 1.8 | 8.8 |

The data set forth in Table 2 indicates that the pressure in the processing chamber 11 and in the remote plasma source 14 decreases as the flow rate of new gas through MFC 21 is decreased. The flow from the recirculation path 722 through MFC 726 is also reduced with decreases in the flow rate of new gas through MFC 21, except that at and below a certain level of flow of new gas (for new gas flow rates of 2.0 slm or less in Table 2) the flow of recirculated gas through MFC 726 remains substantially constant. It will be noted that for a flow rate of new gas of 0.5 slm the combined flow of both new and recirculated gas is about 3 slm, and the chamber pressure and remote plasma source pressure measurements correspond to those resulting from a 3.0 slm flow of new gas in the baseline data shown in Table 1.

The experimental arrangement was also operated to emulate mode (b) (steady state with full recirculation). Valves 716, 718 and 710 were closed and valve 720 was opened. Initially, MFC 21 was operated to allow various quantities of gas to be captured in the system. Then MFC 21 was closed. Meanwhile, MFC 726 was controlled to vary the amount of recirculated gas allowed to flow from the recirculation path 722. The resulting pressure levels in the processing chamber 11 ($P_{CVD}$) the remote plasma source 14 ($P_{RPS}$) and the volume used in place of the separation and filtering unit 724 ("$P_{SEP}$") were measured.

Table 3(a) presents the results obtained when the amount of gas captured prior to closing the MFC 21 was 1.1 liter.

TABLE 3 (a)

(1.1 liter of gas captured)

| MFC 726, slm | $P_{CVD}$, torr | $P_{RPS}$, torr | $P_{SEP}$, torr |
| --- | --- | --- | --- |
| 2.5 | 1.52 | 7.7 | 171. |
| 2.0 | 1.23 | 6.5 | 174. |
| 1.5 | 0.94 | 5.2 | 177. |
| 1.0 | 0.66 | 3.9 | 180. |
| 0.2 | 0.22 | 1.4 | 182. |

Table 3(b) presents the data obtained when the amount of gas captured prior to closing the MFC 21 was 1.3 liter.

TABLE 3 (b)

(1.3 liter of gas captured)

| MFC 726, slm | $P_{CVD}$, torr | $P_{RPS}$, torr | $P_{SEP}$, torr |
| --- | --- | --- | --- |
| 2.9 | 1.73 | 8.5 | 198. |
| 2.8 | 1.71 | 8.4 | 195. |
| 2.0 | 1.23 | 6.5 | 198. |
| 1.5 | 0.94 | 5.2 | 198. |
| 1.0 | 0.66 | 3.9 | 199. |

Table 3(c) presents the results obtained when the amount of gas captured prior to closing the MFC 21 was 1.6 liter.

TABLE 3 (c)

(1.6 liter of gas captured)

| MFC 726, slm | $P_{CVD}$, torr | $P_{RPS}$, torr | $P_{SEP}$, torr |
| --- | --- | --- | --- |
| 3.5 | 2.08 | 9.8 | 238. |
| 2.9 | 1.73 | 8.5 | 236. |
| 2.0 | 1.22 | 6.4 | 238. |
| 1.5 | 0.92 | 5.1 | 238. |
| 1.0 | 0.64 | 3.8 | 236. |

The results of Tables 3(b) and (c) show that when the flow of recirculated gas through MFC 726 is at a level of 2.9 slm, very similar processing chamber and remote plasma source pressures are obtained to those shown in the baseline data (Table 1) for a 3.0 slm flow rate of new gas through the MFC 21. The pressure in the volume used in place of the separation and filtering unit 724 generally increased when the amount of gas captured increased.

Figure 8A:
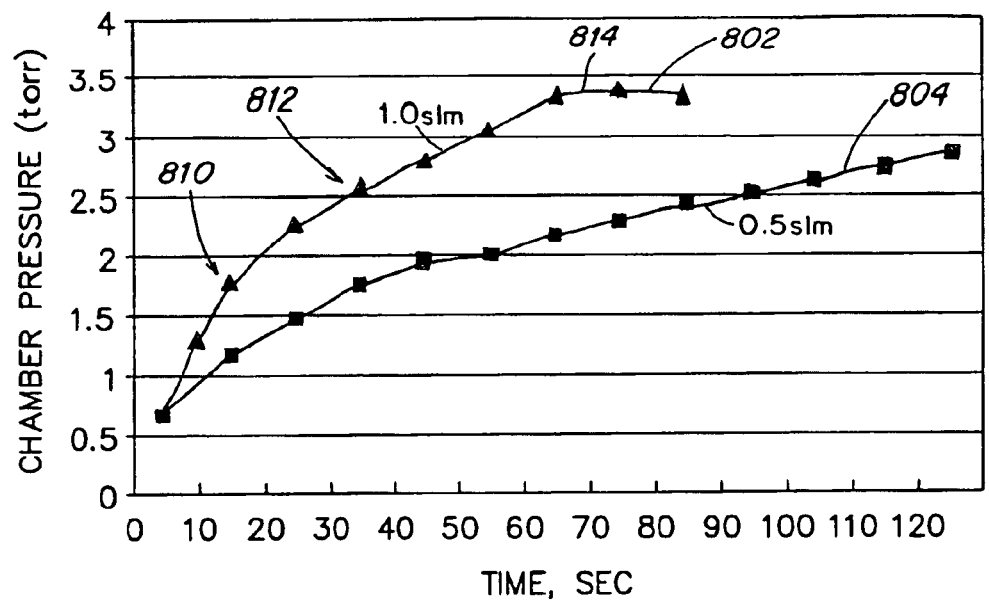
FIGS. 8(a) and 8(b) graphically illustrate pressure measurements obtained in an experimental simulation of the processing chamber cleaning system of FIG. 7.
Figure 8B:
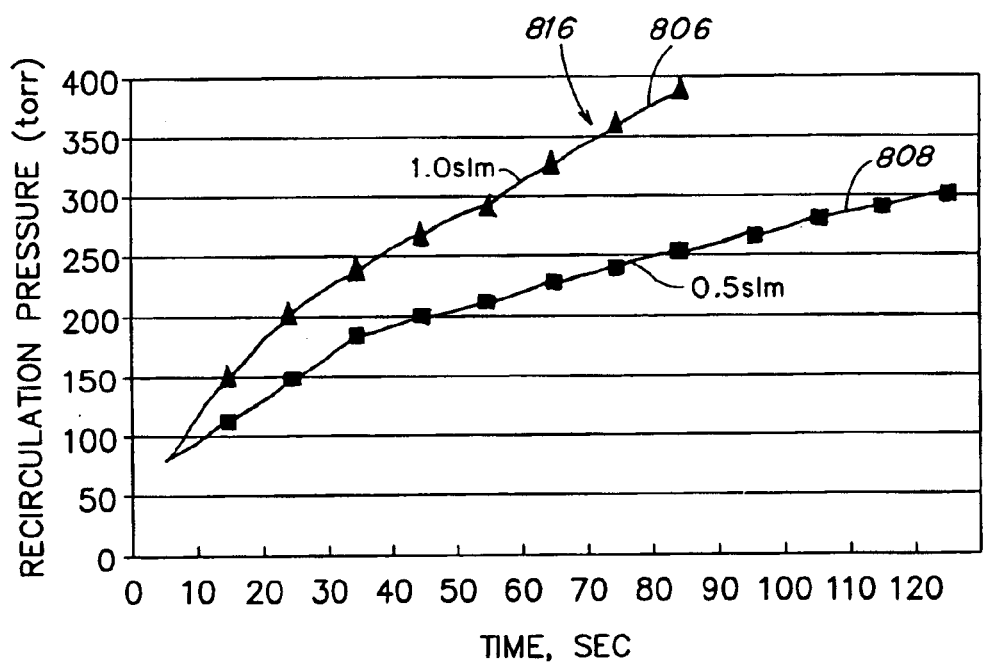

The experimental arrangement was also operated to model mode (c), in which the pressure was dynamically increased. Valves 716, 718 and 712 were closed and valve 720 was opened. MFC 21 controlled the flow rate of incoming gas, while MFC 726 was fully opened and, at least initially, did not limit the flow rate of the recirculating gas. FIG. 8(a) graphically presents dynamic changes in the pressure in the processing chamber 11. FIG. 8(b) graphically presents dynamic changes in the pressure in the volume used in place of the separation and filtering unit 724 (recirculation pressure).

In FIG. 8(a) curve 802 indicates the change in chamber pressure during the course of a simulated cleaning operation with new gas admitted via MFC 21 at a rate of 1.0 slm. Curve 804 indicates the change in chamber pressure with new gas admitted via MFC 21 at a rate of 0.5 slm. In FIG. 8(b) curve 806 indicates the change in recirculation pressure with gas admitted through MFC 21 at 1.0 slm, and curve 808 shows the change in recirculation pressure with gas admitted through MFC 21 at a rate of 0.5 slm.

Curve 802 in FIG. 8(a) shows three stages in chamber pressure growth when the flow rate through MFC 21 is 1.0 slm. Initially, a transient stage, mainly due to pressure and flow establishment across the system, lasts about 20 to 30 seconds. This stage is shown at 810 in FIG. 8(a). Then at a second stage, indicated at 812, the chamber pressure increases at a slower rate. Then at a final stage, beginning about 60 to 70 seconds into the process, the chamber pressure remains substantially constant, as indicated at 814 in FIG. 8(a), while the pressure in the recirculation path continues to increase, as indicated at 816 in FIG. 8(b). The constant chamber pressure indicated at 814 in curve 802 is due to the effect of the fully open. MFC 726 limiting the flow of gas out of the recirculation path 722. When the incoming gas flow rate is low (0.5 slm, curve 804, FIG. 8(a)) the last stage (substantially constant chamber pressure) is delayed and chamber pressure continues to increase for an extended period of time.

The above-described experiments modeling the embodiment of FIG. 7 indicate that satisfactory control of chamber pressure can be achieved by suitable operation of either or both of MFC 21 and MFC 726. Also, as noted above, the chamber pressure control techniques of the above-referenced U.S. Pat. No. 5,944,049 can be employed either alone or in combination with controlling chamber pressure via the MFC 21 and/or MFC 726.

It is contemplated to apply the apparatus disclosed herein so that recirculation is performed during a fabrication process cycle, such as a deposition cycle. For example, it is contemplated to employ recirculation of outlet gas during a fluorinated silicate glass (FSG) deposition cycle in which a fluoride doped $SiO_2$ layer is formed on a substrate, using $SiF_4$ as a precursor process gas. By using recirculation in this case it may be possible to improve the low process gas utilization rate experienced in conventional FSG processes.

The embodiments of the present invention described with reference to FIGS. 1–8(b) may be employed with any suitable chamber such as a plasma enhanced CVD (PECVD) chamber, a sub-atmospheric CVD (SACVD) chamber, a high pressure CVD (HPCVD) chamber, a low K CVD chamber, a metal CVD chamber, an etching chamber, or the like. Each embodiment may be implemented in a modular, mobile and/or retrofittable configuration. While the present invention has been described primarily with reference to an $NF_3$ cleaning gas and $SiF_4$ reaction product, it will be understood that other gases may be employed and/or recirculated and/or other reaction products may be separated from an outlet gas of a processing chamber in accordance with one or more embodiments of the invention.

The foregoing description discloses only exemplary embodiments of the invention, and modifications of the above disclosed apparatus and methods which fall within the scope of the invention will be readily apparent to those of ordinary skill in the art. Accordingly, while the present invention has been disclosed in connection with exemplary embodiments thereof, it should be understood that other embodiments may fall within the spirit and scope of the invention, as defined by the following claims.

What is claimed is:

1. A processing system comprising:

a processing chamber having an inlet and an outlet;

a remote plasma source having an inlet and having an outlet coupled to the inlet of the processing chamber;

a first valve having an outlet coupled to the inlet of the remote plasma source, a first inlet and a second inlet;

a flow controller having an inlet adapted to couple to a cleaning gas source and having an outlet coupled to the first inlet of the first valve;

a second valve having an inlet coupled to the outlet of the processing chamber, a first outlet adapted to couple to an exhaust path, and a second outlet;

a recirculation pump having an inlet coupled to the second outlet of the second valve, and an outlet;

a separation unit having an inlet coupled to the outlet of the recirculation pump, and an outlet, the separation unit adapted to separate a reaction product from a gas flowed to the separation unit;

a filtering mechanism having an inlet coupled to the outlet of the separation unit, and an outlet, the filtering mechanism adapted to filter particles from a gas flowed to the filtering mechanism; and a pressure adjustment mechanism having an inlet coupled to the outlet of the filtering mechanism and an outlet coupled to the second inlet of the first valve, the pressure adjustment mechanism adapted to adjust a pressure level of a gas flowed to the pressure adjustment mechanism.

2. The processing system of claim 1, wherein the separation unit is adapted to condense a reaction product.

3. The processing system of claim 1, wherein the separation unit is adapted to adsorb a reaction product.

4. The processing system of claim 1, wherein the processing chamber is adapted to perform a vapor deposition process with respect to a substrate.

5. The processing system of claim 1, wherein the remote plasma source is selected from the group consisting of a microwave discharge plasma source, an inductively coupled plasma source, a silent barrier discharge plasma source, a capacitively coupled plasma source and a toroidal plasma source.

6. The processing system of claim 1, wherein the pressure adjustment mechanism is adapted to adjust the pressure level of gas flowed to the pressure adjustment mechanism so as to substantially match a pressure level of cleaning gas flowed to the first inlet of the first valve.

* * * * *